(12) United States Patent
Park et al.

(10) Patent No.: US 8,841,647 B2
(45) Date of Patent: Sep. 23, 2014

(54) FLEXIBLE SUBSTRATE AND FLEXIBLE DISPLAY DEVICE HAVING THE SAME

(75) Inventors: Yong In Park, Anyang-si (KR); Seung Han Paek, Incheon (KR); Sang Soo Kim, Anyang-si (KR)

(73) Assignee: LG Display Co., Ltd., Seoul (KR)

( * ) Notice: Subject to any disclaimer, the term of this patent is extended or adjusted under 35 U.S.C. 154(b) by 250 days.

(21) Appl. No.: 11/987,390

(22) Filed: Nov. 29, 2007

(65) Prior Publication Data

US 2008/0138633 A1 Jun. 12, 2008

(30) Foreign Application Priority Data

Dec. 12, 2006 (KR) .................. 10-2006-0126171

(51) Int. Cl.

| H01L 29/06 | (2006.01) |
| G02F 1/167 | (2006.01) |
| G02F 1/1333 | (2006.01) |
| H01L 51/00 | (2006.01) |
| H01L 51/52 | (2006.01) |

(52) U.S. Cl.
CPC ............ *G02F 1/167* (2013.01); *G02F 2201/50* (2013.01); *Y02E 10/549* (2013.01); *G02F 1/133345* (2013.01); *G02F 1/133305* (2013.01); *H01L 51/0097* (2013.01); *G02F 2201/501* (2013.01); *H01L 2251/5338* (2013.01); *H01L 51/5237* (2013.01)

USPC ........ 257/5; 257/737; 257/778; 257/E23.023; 438/108; 438/125; 438/612; 438/22

(58) Field of Classification Search
USPC ........... 257/86, E27.111, 79, 40; 438/21, 455
See application file for complete search history.

(56) References Cited

U.S. PATENT DOCUMENTS

| 5,757,126 A * | 5/1998 | Harvey et al. ................. 313/506 |
| 6,506,438 B2 | 1/2003 | Duthaler et al. |
| 2002/0053320 A1 * | 5/2002 | Duthaler et al. .............. 118/249 |
| 2003/0127973 A1 | 7/2003 | Weaver et al. |
| 2003/0173890 A1 | 9/2003 | Yamazaki et al. |
| 2004/0027327 A1 * | 2/2004 | LeCain et al. ................ 345/107 |
| 2005/0104845 A1 * | 5/2005 | Moon ........................... 345/107 |
| 2006/0131602 A1 * | 6/2006 | Ouderkirk et al. ............ 257/100 |

FOREIGN PATENT DOCUMENTS

| CN | 1445596 | 10/2003 |
| JP | 2002-540591 | 11/2002 |
| WO | WO 03/094256 A2 | 11/2003 |
| WO | WO2005/064993 A1 * | 7/2005 | .................... 428/446 |
| WO | WO 2005/064993 A1 | 7/2005 |
| WO | WO 2006/107379 | 10/2006 |

* cited by examiner

*Primary Examiner* — Mark A Laurenzi
(74) *Attorney, Agent, or Firm* — McKenna Long & Aldridge LLP

(57) ABSTRACT

A flexible substrate includes: a flexible base substrate; a plurality of display structures on a first surface of the flexible base substrate; and a barrier coating on a second surface of the flexible base substrate to prevent contaminants from penetrating into the display structures.

8 Claims, 2 Drawing Sheets

1

FLEXIBLE SUBSTRATE AND FLEXIBLE DISPLAY DEVICE HAVING THE SAME

This application claims the benefit of Korean Patent Application No. 126171/2006, filed on Dec. 12, 2006, which is hereby incorporated by reference for all purposes as if fully set forth herein.

BACKGROUND OF THE INVENTION

The present disclosure relates to a flexible substrate and a flexible display device having the same.

Recently, liquid crystal display (LCD) devices, organic light emitting diodes (OLEDs), and electrophoresis display device using a lightweight flexible substrate having a thin thickness and an excellent impact proof characteristic are under development. These display devices are generally called flexible display devices.

A related art electrophoresis display device includes an ink substrate including an ink layer formed on a flexible substrate, and a driving substrate including thin film transistors formed on a flexible substrate. The electrophoresis display device can be formed by laminating the ink substrate on the driving substrate.

Since the substrates primarily include polymer materials, oxygen and moisture may easily penetrate into the substrate. Oxygen and moisture reduce the lives of the ink layer and the thin film transistors.

To prevent contaminants such as oxygen and moisture from penetrating into a substrate, a protection sheet is laminated on a first surface opposite to a second surface where the ink layer has been formed, i.e., an outer surface of the substrate.

However, since the protection sheet is formed of polymer material such as plastics, it has a limitation in blocking contaminants such as oxygen and moisture.

Also, in the case where the protection sheet is used to prevent contaminants such as oxygen and moisture from penetrating into the substrate, an additional process for laminating the protection sheet on the flexible substrate is required and manufacturing costs considerably increase.

Also, the entire thickness of the substrate increases due to the protection sheet, and accordingly, the flexibility of the substrate deteriorates.

SUMMARY OF THE INVENTION

According, the present invention is directed to a flexible substrate and flexible display device having the same that substantially obviates one or more of the problems due to limitations and disadvantages of the related art.

An advantage of the present invention is to provide a flexible substrate that can efficiently block contaminants such as oxygen and/or moisture.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a flexible substrate includes: a flexible base substrate; a plurality of display structures on a first surface of the flexible base substrate; and a barrier coating on a second surface of the flexible base substrate to prevent contaminants from penetrating into the display structures.

In another aspect of the present invention, a flexible substrate includes: a flexible base substrate; an ink layer on a first surface of the flexible base substrate, the ink layer including fine particles reacting to an electric field to display an image; and a barrier coating on a second surface of the flexible base substrate.

In yet another aspect of the present invention, a flexible substrate includes: a flexible base substrate; a plurality of driving devices on a first surface of the flexible base substrate; and a barrier coating on a second surface of the flexible base substrate.

In yet another aspect of the present invention, a flexible display device includes: an ink substrate having an ink layer; a driving substrate having a plurality of driving devices, wherein the driving substrate is on the ink substrate; and a barrier coating on an outer surface of at least one of the ink substrate and the driving substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Figure 1:
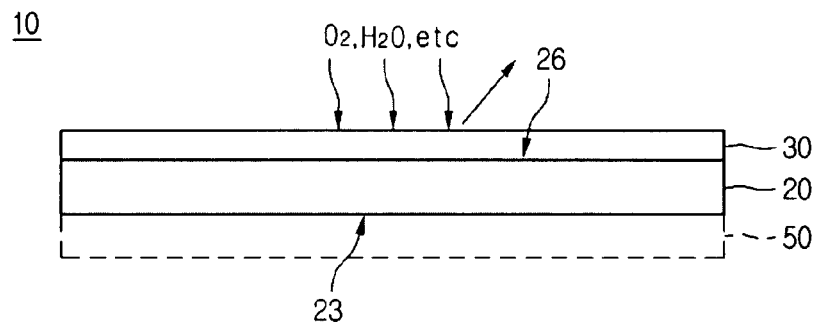
FIG. 1 is a cross-sectional view of a flexible substrate according to an embodiment.

Though a flexible substrate and a flexible display device are described below in detail according to embodiments of the present disclosure with reference to the accompanying drawings, the present disclosure is not limited thereto, but a person of ordinary skill in the art would realize the present disclosure in various other forms without departing from the spirit and scope of the present disclosure. In the drawings, dimensions of a base substrate, a display structure, and a barrier coating are exaggerated for clarity.

In the following description, it will be understood that when a base substrate, a display structure, a barrier coating, and other structures are referred to as being 'on' or 'under' the base substrate, the display structure, the barrier coating, and other structures, it can be directly on the base substrate, the display structure, the barrier coating, and other structures, or intervening layers may also be present, or another base substrate, another display structure, another barrier coating, and other structures can be additionally formed on a flexible substrate and a flexible display device. In addition, in the drawings, the size and thickness of a device can be exaggerated for convenience. Like reference numerals refer to like elements throughout the specification.

References will now be made in detail to an embodiment of the present invention, example of which is illustrated in the accompanying drawings.

FIG. 1 is a cross-sectional view of a flexible substrate according to an embodiment.

Referring to FIG. 1, the flexible substrate 10 may have a flexible plate shape or a sheet shape.

The flexible substrate 10 includes a flexible base substrate 20 and a barrier coating 30.

The base substrate 20 may be formed of plastic.

The base substrate 20 has a first surface 23 and a second surface 26.

A plurality of display structures 50 for displaying an image are disposed on the first surface 23 of the base substrate 20.

In an embodiment, the display structures 50 can be a thin film transistor (TFT) and a pixel electrode connected to the TFT, a TFT and an organic light emitting layer connected to the TFT, or a TFT and an ink layer connected to the TFT.

The barrier coating 30 is disposed on the second surface 26 of the base substrate 20.

The barrier coating 30 can be a polymer-based organic layer or an inorganic layer such as silicon nitride or silicon oxide.

Also, the barrier coating 30 can be formed using an oxide-based metal layer including indium-tin-oxide (ITO) and indium-zinc-oxide (IZO) that can prevent penetration of oxygen and moisture. The oxide-based metal layer may be grounded to prevent electrostatic discharge (ESD) being applied to the base substrate 20 and/or the display structures 50.

Meanwhile, the barrier coating 30 can be formed using a transparent layer with consideration of the optical characteristic of the flexible substrate 10.

Therefore, the barrier coating 30 prevents moisture and/or oxygen introduced via the second surface 26 of the base substrate 20 from penetrating into the first surface 23 on which the display structures 50 have been formed, thereby protecting the display structures 50 from contaminants such as moisture and/or oxygen.

As described above, since the barrier coating 30 including an organic material and/or an inorganic material is formed on the base substrate 20 of the flexible substrate 10, material costs reduces. Since a process for laminating the related art protection sheet is not required, a process can be simplified. Also, since the barrier coating 30 can be formed in a very thin thickness, a thickness increase of the flexible substrate 10 can be prevented while a flexibility characteristic of the base substrate 20 is substantially maintained.

Figure 2A:
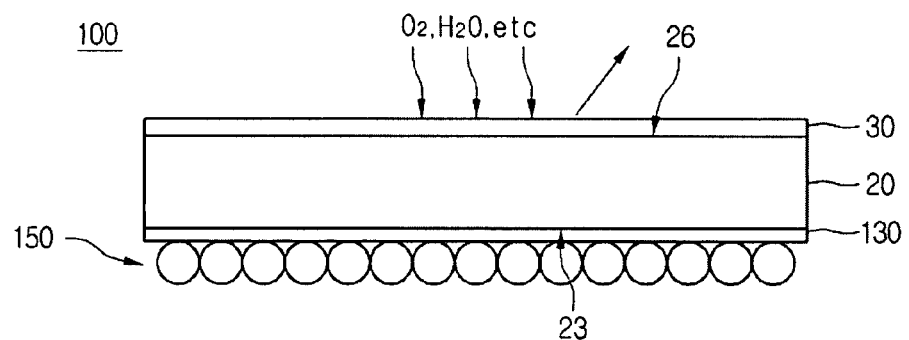
FIGS. 2A and 2B are cross-sectional views illustrating embodiments of a flexible substrate.
Figure 2B:
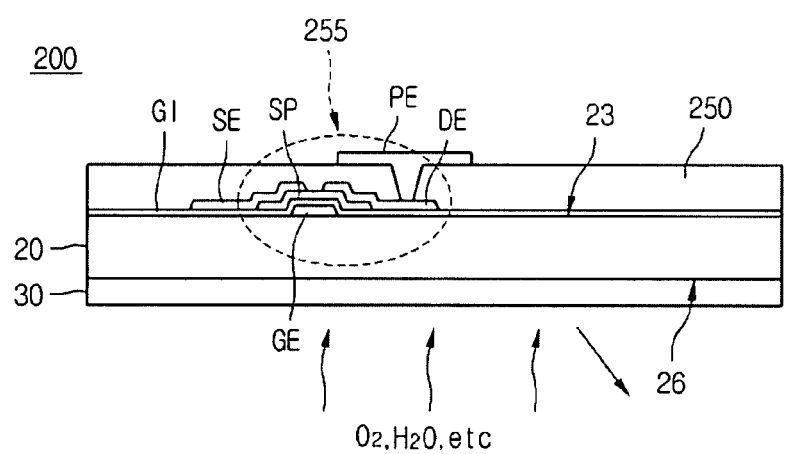

FIGS. 2A and 2B are cross-sectional views illustrating embodiments of a flexible substrate according to an embodiment.

FIG. 2A illustrates the flexible substrate is used as an ink substrate, and FIG. 2B illustrates the flexible substrate is used as a driving substrate.

Referring to FIG. 2A, the ink substrate 100 includes a flexible base substrate 20 having a first surface 23 and a second surface 26, and a barrier coating 30 disposed on the second surface 26 of the base substrate 20.

An ink layer 150 including fine particles is disposed on the first surface 23, which is an opposite surface of the second surface 26 of the base substrate 20.

A common electrode 130 is interposed between the first substrate 23 of the base substrate 20 and the ink layer 150.

The ink layer 150 disposed on the first surface 23 of the base substrate 20 includes a plurality of microcapsules and a plurality of fine particles received in the microcapsules. Each of the microcapsules including the fine particles serves as a pixel for displaying an image.

The barrier coating 30 can prevent moisture and/or oxygen from penetrating through the base substrate 20. Moisture and/or oxygen that has penetrated from the second surface 26 to the first surface 23 of the base substrate 20 may deteriorate the microcapsules and/or fine particles.

In an embodiment, the barrier coating 30 can be a single layer formed of an organic layer or an inorganic layer. Unlike this, the barrier coating 30 can be formed using a plurality of layers including an organic layer and an inorganic layer. The barrier coating 30 can be formed of $SiO_2$ or $SiN_x$. Unlike this, the barrier coating 30 can be an oxide-based metal layer including ITO and IZO.

As described above, the barrier coating 30 can protect the fine particles of the ink layer from contaminants such as moisture.

Here, in the case where the barrier coating 30 is formed of ITO and IZO, the common electrode 130 is formed of ITO and IZO, simultaneously with the forming of the barrier coating 30. That is, after one deposition process equipment forms the common electrode 130 on the first surface 23 of the base substrate 20, the base substrate 20 is put upside down, and the barrier coating 30 can be formed of ITO or IZO on the second surface 26 of the substrate 20.

Therefore, in the case where the barrier coating 30 including an oxide-based metal such as ITO and IZO is formed, a process for forming the barrier coating 30 can be more simplified.

The barrier coating 30 is disposed on the second surface 26 of the base substrate 30, the common electrode 130 is disposed on the first surface 23, and the ink layer 150 is disposed on the common electrode, so that the ink substrate 100 can be manufactured.

Referring to FIG. 2B, a driving substrate 200 includes a flexible base substrate 20, a plurality of driving devices 255 disposed on a first surface 23 of the base substrate 20, and a barrier coating 30 disposed on a second surface 26, which is an opposite surface of the first surface 23.

The base substrate 20 can be formed of plastic.

The driving device 255 disposed on the first surface 23 of the base substrate 20 can include a TFT and a pixel electrode PE.

The TFT includes a gate electrode GE branching off from a gate line, an insulating layer GI covering the gate line and the gate electrode GE, a semiconductor pattern SP disposed on the insulating layer GI and overlapping the gate electrode GE, and a source electrode SE and a drain electrode DE disposed on the semiconductor pattern SP.

The TFT is covered with an organic layer 250 having an opening exposing the drain electrode DE. The pixel electrode PE connected to the drain electrode DE is formed in the organic layer 250.

The pixel electrode PE is a transparent and conductive thin film. Examples of materials that can be used for the pixel electrode PE include ITO and IZO.

The barrier coating 30 is disposed on the second surface 26 of the base substrate 20. The barrier coating 30 can be formed of an organic layer and/or an inorganic layer. The barrier coating 30 can prevent oxygen and/or moisture from sequentially passing through the second surface 26 and the first surface 23 of the base substrate 20 and deteriorating the driving device 255 including the TFT and the pixel electrode PE.

As described above, the driving device 255 is disposed on the base substrate 20, so that the driving substrate 200 can be manufactured. Therefore, the barrier coating 30 prevents the driving device 255 from being deteriorated by oxygen and/or moisture to allow a flexible display device that can be formed later to stably operate.

Figure 3:
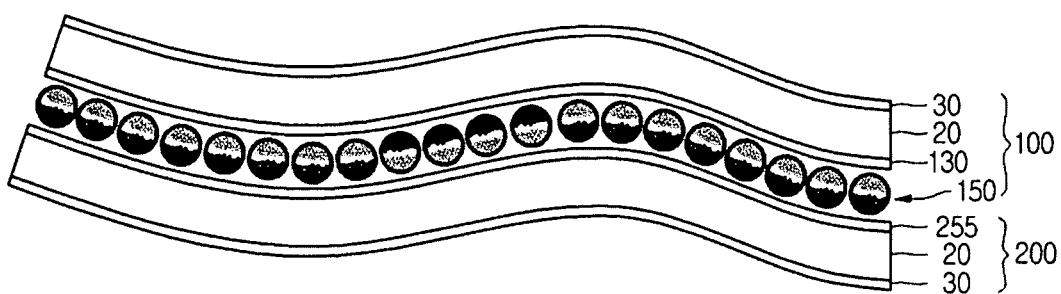
FIG. 3 is a schematic cross-sectional view of a flexible display device according to an embodiment.

FIG. 3 is a schematic cross-sectional view of a flexible display device according to an embodiment. Here, an ink substrate and a driving substrate are described with reference to FIGS. 2A and 2B.

Flexible substrates 100 and 200 are important parts determining the performance, reliability, and price of the flexible display device 1.

The flexible display device 1 can be formed by laminating an ink substrate 100 on a driving substrate 200.

The ink substrate 100 includes a common electrode 130 disposed on the base substrate 20, and an ink layer 150 having a plurality of fine particles.

The driving substrate 200 has a driving device 255 including a TFT and a pixel electrode PE. The driving device 255 is formed on the base substrate 20.

The flexible display device 1 can drive the fine particles formed on the ink layer 150 to display an image when a voltage is applied to the pixel electrode E and the common electrode 130.

The driving device 255 and the ink layer 150 can be disposed on the first surfaces of the base substrates 20 of the driving substrate 200 and the ink substrate 100, respectively. Also, the barrier coatings 30 can be disposed on the second surfaces 26 of the base substrates 20 of the ink substrate 100 and the driving substrate 200, respectively.

The barrier coating 30 of the ink substrate 100, and the barrier coating 30 of the driving substrate 200 can prevent moisture and/or oxygen from penetrating between the ink substrate 100 and the driving substrate 200.

Therefore, the barrier coating 30 can prevent a malfunction of the ink layer 150 that has been exposed to moisture and/or oxygen to absorb the moisture. Also, phenomenon that the driving device 255 is exposed to oxygen and deteriorated can be prevented. In other words, the barrier coating 30 can prevent contaminants such as moisture from penetrating into the flexible display device 1.

Meanwhile, as in the embodiments, the flexible display device 1 can also be formed by applying the flexible substrate to each of the ink substrate 100 and the driving substrate 200. In other embodiment, the base substrate of the driving substrate 200 can be formed of glass or metal instead of plastic. In this case, the driving substrate can sufficiently prevent penetration of moisture and/or oxygen. Therefore, the barrier coating 120 can be disposed on only the ink substrate 100 using the base substrate 20 that is flexible and can transmit moisture.

As described above, the barrier coating 30 can prevent contaminants from contacting the ink layer 150 and the driving device 255.

Therefore, malfunctions of the ink layer 150 and the driving layer 250 are prevented, so that reliability in a displayed image of the flexible display device 1 can be improved.

As described above, the flexible substrate according to an embodiment provides the barrier coating on the flexible base substrate to protect the display structures formed on an opposite surface of the barrier coating from contaminants such as external moisture.

According to the flexible substrate, since a separate protection sheet is not used on the base substrate, material costs reduce, and a process can be simplified.

Since the barrier coating is formed to have a thin thickness, the thickness of the flexible substrate can be reduced while a flexible characteristic of the base substrate is maintained.

The barrier coating included in the flexible substrate according to an embodiment of the prevent contaminants from being introduced into the ink layer and the driving layer. Accordingly, malfunctions of the ink layer and the driving layer are prevented, so that reliability in a displayed image of the flexible display device improves.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A flexible substrate comprising:
a flexible base substrate;
a common electrode on a first surface of the flexible base substrate;
a plurality of display structures on the common electrode;
a single-layer barrier coating of an oxide-based metal layer on a second surface of the flexible base substrate to prevent contaminants from penetrating into the display structures; and
a ground physically connected to the barrier coating,
wherein the plurality of display structures is not between the common electrode and the barrier coating.

2. The flexible substrate according to claim 1, wherein the display structures include an ink layer having fine particles.

3. The flexible substrate according to claim 1, wherein the barrier coating and the common electrode include one of an indium-tin-oxide layer and an indium-zinc-oxide layer.

4. A flexible substrate comprising:
a flexible base substrate;
a common electrode on a first surface of the flexible base surface;
an ink layer on the common electrode, the ink layer including fine particles reacting to an electric field to display an image;
a single-layer barrier coating of an oxide-based metal layer on a second surface of the flexible base substrate; and
a ground physically connected to the barrier coating,
wherein the ink layer is not between the common electrode and the barrier coating.

5. The flexible substrate according to claim 4, wherein the barrier coating and the common electrode include one of indium-tin-oxide and indium-zinc-oxide.

6. A flexible display device comprising:
an ink substrate having a common electrode and an ink layer;
a driving substrate having a plurality of pixel driving devices, wherein the driving substrate is on the ink substrate such that the ink layer contacts the plurality of pixel driving devices;
a first and a second single-layer barrier coating of an oxide-based metal layer on an outer surface of the ink substrate and the driving substrate; and
a ground directly contacted to the barrier coating,
wherein the ink layer is not between the common electrode and a first single-layer barrier coating.

7. The flexible substrate according to claim 1, wherein the thickness of the barrier coating is such that the flexibility of the base substrate is substantially maintained.

8. The flexible substrate according to claim 1, after deposition process equipment has formed the common electrode on the first surface of the base substrate, the base substrate is put upside down, and the barrier layer is formed on the second surface of the base substrate.

* * * * *